US009443582B2

(12) United States Patent
Jung et al.

(10) Patent No.: US 9,443,582 B2
(45) Date of Patent: Sep. 13, 2016

(54) NONVOLATILE MEMORY DEVICE AND METHOD FOR TESTING NONVOLATILE MEMORY DEVICE USING VARIABLE RESISTANCE MATERIAL

(71) Applicant: SAMSUNG ELECTRONICS CO., LTD., Suwon-Si, Gyeonggi-Do (KR)

(72) Inventors: Moon-Ki Jung, Seoul (KR); Ki-Won Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 14/463,376

(22) Filed: Aug. 19, 2014

(65) Prior Publication Data

US 2015/0124515 A1 May 7, 2015

(30) Foreign Application Priority Data

Nov. 5, 2013 (KR) ........................ 10-2013-0133579

(51) Int. Cl.

*G11C 11/00* (2006.01)
*G11C 13/00* (2006.01)
*G11C 7/14* (2006.01)
*G11C 29/02* (2006.01)
*G11C 29/50* (2006.01)

(52) U.S. Cl.

CPC ............. *G11C 13/0002* (2013.01); *G11C 7/14* (2013.01); *G11C 13/004* (2013.01); *G11C 29/021* (2013.01); *G11C 29/026* (2013.01); *G11C 29/028* (2013.01); *G11C 29/50008* (2013.01); *G11C 2013/0054* (2013.01); *G11C 2213/71* (2013.01); *G11C 2213/72* (2013.01)

(58) Field of Classification Search

CPC ...................................................... G11C 11/00
USPC ...................................................... 365/185.03
See application file for complete search history.

(56) References Cited

U.S. PATENT DOCUMENTS 5,872,736 A * 2/1999 Keeth .................. G11C 7/1042 326/83
6,356,475 B1 3/2002 Tamura et al.
6,819,596 B2 11/2004 Ikehashi et al.
7,800,932 B2 9/2010 Kumar et al.
7,961,496 B2 6/2011 Baek et al.
2010/0091535 A1* 4/2010 Sommer .................. G11C 8/20 365/45
2010/0131809 A1* 5/2010 Katz .................. G06F 12/0246 714/719
2012/0051157 A1 3/2012 Nakanishi et al.
2012/0087183 A1 4/2012 Chang
2012/0230080 A1 9/2012 Chang et al.

(Continued)

FOREIGN PATENT DOCUMENTS

KR 20120136662 A 12/2012
KR 20130021095 A 3/2013

*Primary Examiner* — Min Huang

(74) *Attorney, Agent, or Firm* — Volentine & Whitt, PLLC

(57) ABSTRACT

A method for testing a nonvolatile memory device includes: monitoring a first resistance dispersion and a second resistance dispersion of a nonvolatile memory device, determining a lower test bias level and an upper test bias level that are disposed on opposite sides of a reference bias level, calculating the number of first fail bits generated in the first resistance dispersion based on the lower test bias level and the number of second fail bits generated in the second resistance dispersion based on the upper test bias level, determining a selected reference bias level using the number of the first fail bits and the number of the second fail bits, and trimming the reference bias level to the selected bias level.

18 Claims, 18 Drawing Sheets

111_1
WL3_1
WL2_1
MC
WL1_1
BL1_1 BL2_1 BL3_1 BL4_1 . . .

(56) References Cited

U.S. PATENT DOCUMENTS

2013/0058153 A1 3/2013 Chang et al.
2014/0056068 A1* 2/2014 Strasser .............. G06F 11/1048 365/185.03
2014/0119114 A1* 5/2014 Motwani ............. G11C 11/5642 365/185.03
2014/0140148 A1* 5/2014 An ...................... G11C 11/5642 365/189.14
2015/0085573 A1* 3/2015 Sharon ................... G11C 29/04 365/185.03
2015/0162057 A1* 6/2015 Alhussien ............ G11C 13/004 365/189.11
2015/0169468 A1* 6/2015 Camp ................. G06F 12/0246 711/207
2015/0199149 A1* 7/2015 Sankaranarayanan G06F 3/0653 711/102
2015/0205664 A1* 7/2015 Janik ................... G06F 11/1012 714/764

* cited by examiner

FIG. 2

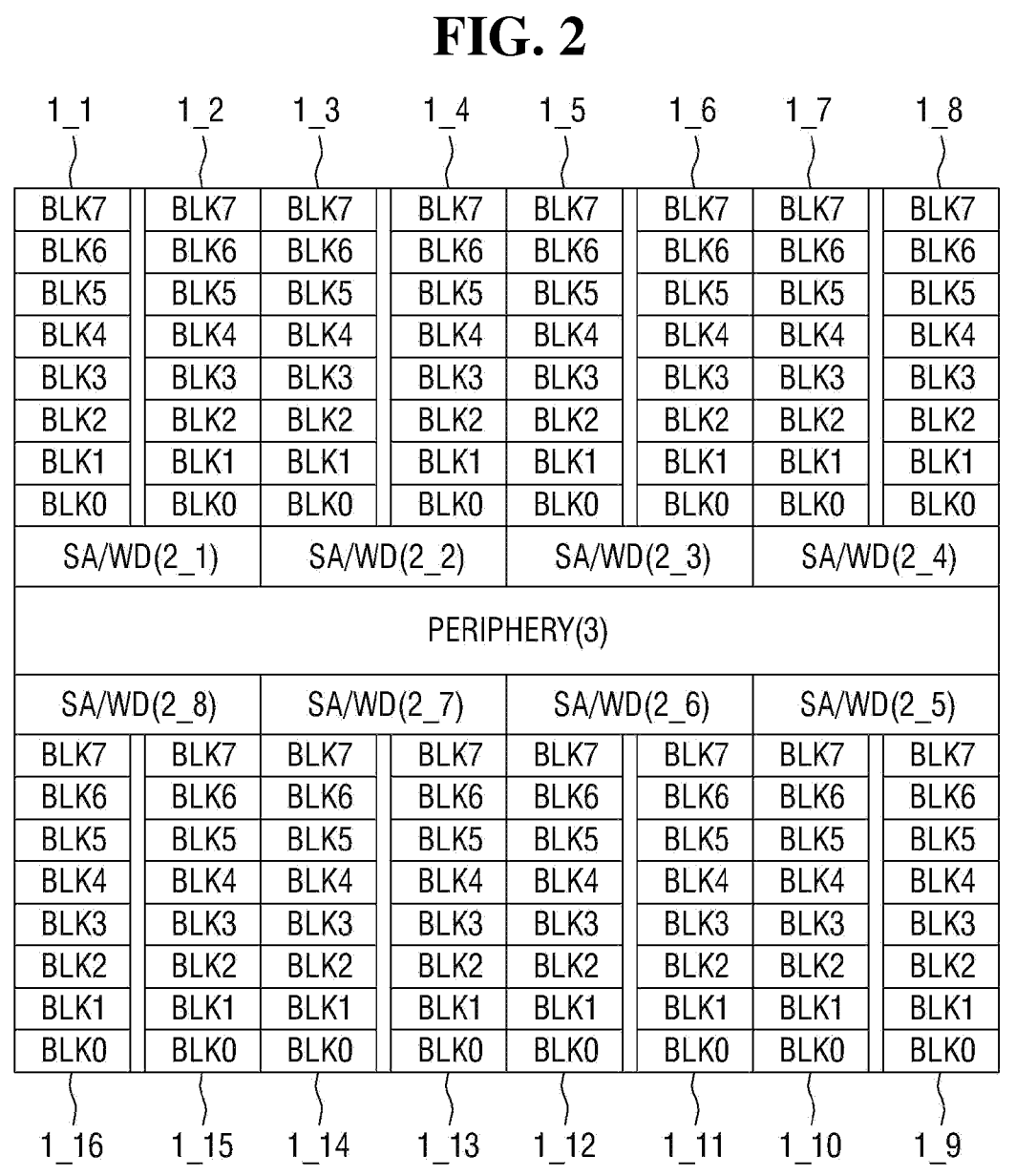

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |

SA/WD(2_1) SA/WD(2_2) SA/WD(2_3) SA/WD(2_4)

PERIPHERY(3)

SA/WD(2_8) SA/WD(2_7) SA/WD(2_6) SA/WD(2_5)

| BLK7 | BLK7 | BLK7 | BLK7 | BLK7 | BLK7 | BLK7 | BLK7 |
|---|---|---|---|---|---|---|---|
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

NONVOLATILE MEMORY DEVICE AND METHOD FOR TESTING NONVOLATILE MEMORY DEVICE USING VARIABLE RESISTANCE MATERIAL

CROSS-REFERENCE TO RELATED APPLICATIONS

This application is based on, and claims priority from, Korean Patent Application No. 10-2013-0133579, filed on Nov. 5, 2013 in the Korean Intellectual Property Office, the disclosure of which is incorporated herein in its entirety by reference.

BACKGROUND

The present inventive concept relates to a nonvolatile memory device and a method for testing a nonvolatile memory device using a variable resistance material.

Nonvolatile memory devices using a resistance material may include a phase change random access memory (PRAM), a resistive RAM (RRAM), a magnetic RAM (MRAM), and the like. A dynamic RAM (DRAM) or a flash memory device stores data using charges, whereas a non-volatile memory device using the resistance material stores data using the state change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

Here, a phase change memory cell will be described as an example. A state of a phase change material is changed to a crystal state or an amorphous state while the phase change material is cooled after being heated. The phase change material in a crystal state has relatively low resistance, and the phase change material in an amorphous state has a relatively high resistance. Accordingly, memory cells where the phase change material is in the crystal state may be defined as storing set data (e.g., logic “1”), and memory cells where the phase change material is in the amorphous state may be defined as storing reset data (e.g., logic “0”).

SUMMARY

Embodiments of the present inventive concept provide a method for testing a nonvolatile memory device using a variable resistance material, which performs trimming of a reference bias level.

Additional advantages, objects, and features of the inventive concept will be set forth in part in the description which follows and in part will become apparent to those having ordinary skill in the art upon examination of the following, or may be learned from practice of the inventive concept.

According to one aspect of the inventive concept, there is provided a method for testing a nonvolatile memory device including: monitoring a first resistance dispersion and a second resistance dispersion of the nonvolatile memory device, determining a lower test bias level and an upper test bias level that are disposed on opposite sides of a reference bias level, determining a number of first fail bits generated in the first resistance dispersion based on the lower test bias and a number of second fail bits generated in the second resistance dispersion based on the upper test bias, determining a selected reference bias level using the number of the first fail bits and the number of the second fail bits, and trimming the reference bias level to the selected reference bias level.

According to another aspect of the inventive concept, there is provided a method for testing a nonvolatile memory device including: monitoring a first resistance dispersion and a second resistance dispersion of the nonvolatile memory device, determining first to n-th candidate reference bias levels, first to n-th upper test bias levels, and first to n-th lower test bias levels, wherein a k-th upper test bias level and a k-th lower test bias level are disposed on opposite sides of a k-th candidate reference bias level, where n is a natural number, and k is equal to or greater than 1 and equal to or less than n, determining a number of first to n-th lower fail bits and a number of first to n-th upper fail bits using the first to n-th upper test bias levels and the first to n-th lower test bias levels, wherein a k-th lower fail bit is generated in the first resistance dispersion based on the k-th lower test bias level, and a k-th upper fail bit is generated in the second resistance dispersion based on a k-th upper test bias level, determining first to n-th sums using the number of the first to n-th lower fail bits and the number of the first to n-th upper fail bits, wherein a k-th sum is calculated using the number of the k-th lower fail bits and the number of the k-th upper fail bits, and determining a selected reference bias level among the first to n-th candidate reference bias levels using the first to n-th sums.

According to yet another aspect of the inventive concept, there is provided a nonvolatile memory device, comprising: a plurality of nonvolatile memory cells each configured to be selectively set and reset to store data therein; a read circuit configured to read the stored data from the memory cells; and a trimming circuit configured to supply a trimming signal to the read circuit to match a trimmed reference bias level of a reference bias which is employed by the read circuit to read the stored data from the memory cells, wherein the trimmed reference bias level minimizes a weighted sum of a number of first fail bits and a number of the second fail bits, wherein the first fail bits are generated in a first resistance dispersion based on a lower test bias level disposed on a first side of the trimmed reference bias level, and wherein the second fail bits are generated in a second resistance dispersion based on an upper test bias level disposed on a second side of the trimmed reference bias level which is opposite the first side.

BRIEF DESCRIPTION OF THE DRAWINGS

The above and other objects, features and advantages of the present inventive concept will be more apparent from the following detailed description taken in conjunction with the accompanying drawings, in which:

FIG. 2 is a layout diagram illustrating a nonvolatile memory device according to some embodiments of the present inventive concept.

DETAILED DESCRIPTION OF THE EMBODIMENTS

Figure 1:
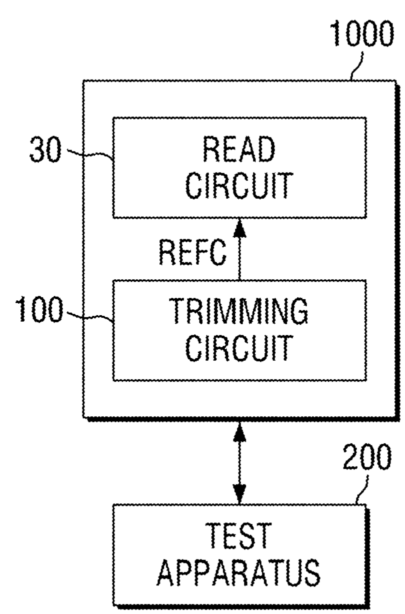
FIG. 1 is a block diagram illustrating a nonvolatile memory device and a test apparatus according to some embodiments of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly broadly or overly narrowly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, preferred embodiments of the present inventive concept will be described using a phase change random access memory (PRAM). However, it will be apparent to those skilled in the art to which the present inventive concept pertains that the present inventive concept can be applied to all nonvolatile memory devices using a resistance material, such as a resistive RAM (RRAM) and a magnetic RAM (MRAM).

FIG. 1 is a block diagram illustrating a nonvolatile memory device and test facilities according to some embodiments of the present inventive concept.

Referring to FIG. 1, a nonvolatile memory device 1000 may include a read circuit 30 and a trimming circuit 100. Read circuit 30 may provide a reference bias or a read bias based on a trimming signal REFC that is provided from trimming circuit 100. Referring to FIGS. 2 to 5, example embodiments of the detailed configuration of nonvolatile memory device 1000 will be described.

A test apparatus 200 performs a test for determining a selected level of the reference bias or the read bias of nonvolatile memory device 1000. Specifically, test apparatus 200 monitors a plurality of resistance dispersions of the nonvolatile memory device 1000 and determines a plurality of test bias levels in consideration of a margin. Test apparatus 200 determines (e.g., calculates) the number of fail bits that may occur in the plurality of resistance dispersions based on the plurality of test bias levels, and determines the selected level of the reference bias (or read bias) so as to minimize the number of fail bits. Trimming circuit 100 provides the trimming signal REFC to read circuit 30 to match the selected level of the reference bias. A detailed test method will be described later with reference to FIGS. 6 to 9. An exemplary configuration of trimming circuit 100 will be described later with reference to FIGS. 10 and 11.

FIG. 2 is a layout diagram illustrating a nonvolatile memory device according to some embodiments of the present inventive concept. In FIG. 2, for convenience in explanation, a nonvolatile memory device composed of 16 memory banks is exemplified, but it should be understood that the nonvolatile memory device according to some embodiments of the present inventive concept is not limited thereto.

Referring to FIG. 2, a nonvolatile memory device according to some embodiments of the present inventive concept includes a memory cell array, a plurality of sense amplifiers and write drivers 2_1 to 2_8, and a peripheral circuit region 3.

The memory cell array may include a plurality of memory banks 1_1 to 1_16, and each of the memory banks 1_1 to 1_16 may include a plurality of memory blocks BLK0 to BLK7. Each of the memory blocks BLK0 to BLK7 may include a plurality of nonvolatile memory cells which are arranged in a matrix form. In the FIG. 2 it is exemplified that the memory blocks are arranged 8 by 8, but embodiments of the present inventive concept are not limited thereto.

A plurality of nonvolatile memory cells are arranged in the memory banks 1_1 to 1_16. In the case where the nonvolatile memory cell is a PRAM cell, the nonvolatile memory cell may include a variable resistance element $Ge_2Sb_2Te_5$ (GST) having a phase change material, and an access element D controlling current that flows to the variable resistance element GST. Here, the access element D may be a diode or a transistor that is connected in series with the variable resistance element GST. Further, various kinds of materials may be used as the phase change materials, such as GaSb, InSb, InSe, Sb2Te3, and GeTe, in which two elements are combined, GeSbTe, GaSeTe, InSbTe, SnSb2Te4, and InSbGe, in which three elements are combined, and AgInSbTe, (GeSn)SbTe, GeSb(SeTe), and Te81Ge15Sb2S2, in which four elements are combined On the other hand, if the nonvolatile memory cell is an RRAM, the variable resistance element may include, for example, NiO or perovskite. The perovskite may be a composition, such as manganite ($Pr_{0.7}Ca_{0.3}MnO_3$, $Pr_{0.5}Ca_{0.5}MnO_3$, other PCMO, LCMO, and the like), titernate (STO:Cr), and zirconate (SZO:Cr, $Ca_2Nb_2O_7$:Cr, and $Ta_2O_5$:Cr). A filament may be formed in the variable resistance element, and the filament becomes a current path of a cell current that penetratingly flows through the resistance memory cell.

Further, although not illustrated in detail in FIG. 2, the nonvolatile memory device may include a row decoder and a column decoder, which designate rows and columns of resistance memory cells to be written/read corresponding to the memory banks 1_1 to 1_16.

Each of the sense amplifiers and write drivers 2_1 to 2_8 are arranged to correspond to two of the memory banks 1_1 to 1_16, and perform read and write operations for the corresponding memory banks. In the embodiment illustrated in FIG. 2 the sense amplifiers and write drivers 2_1 to 2_8 each correspond to two memory banks 1_1 to 1_16, but in general a nonvolatile memory device according to the present inventive concept is not limited to this. That is, the sense amplifiers and write drivers 2_1 to 2_8 may be arranged to correspond each to one, or four, or some other number of memory banks.

In peripheral circuit region 3, a plurality of logic circuit blocks may be arranged for operating the row decoder, the column decoder, the sense amplifiers and write drivers 2_1 to 2_8 and a voltage generator.

Figure 3:
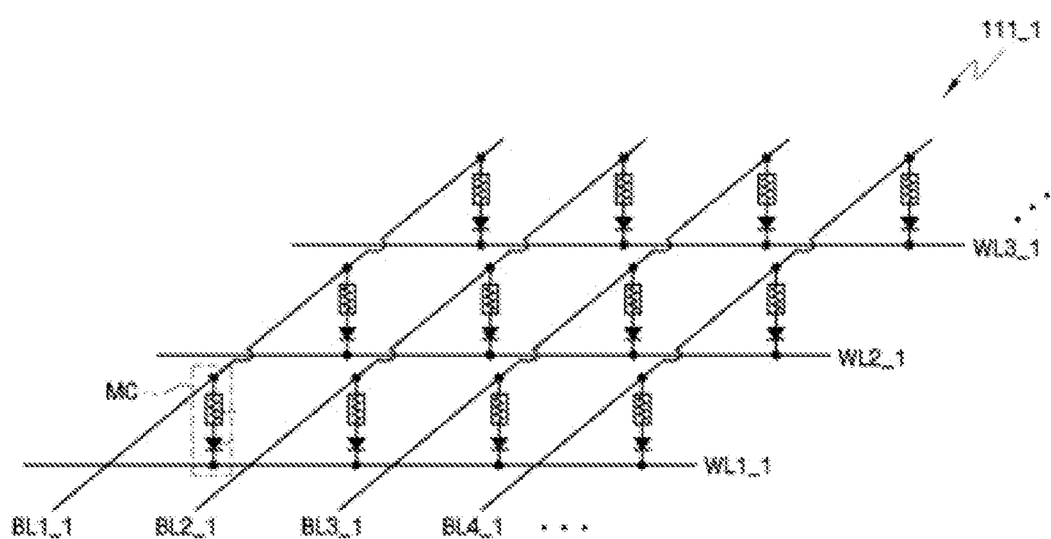
FIGS. 3 and 4 illustrate an embodiment of a memory cell array of FIG. 2.
Figure 4:
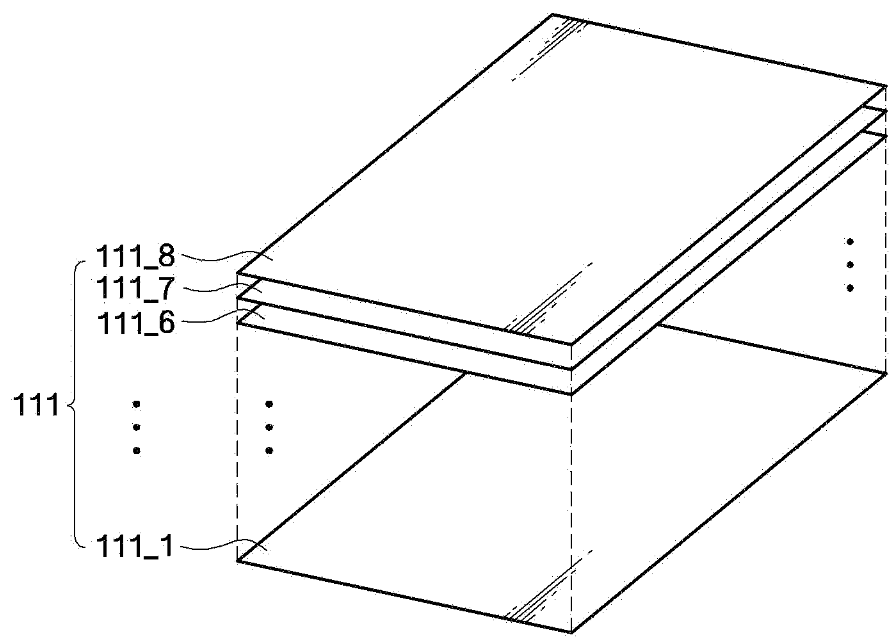

FIGS. 3 and 4 illustrate an embodiment of a memory cell array of FIG. 2.

Referring to FIG. 3, the memory cell array may have a cross point structure. The cross point structure means a structure in which one memory cell is formed in a region where one line and another line cross each other. For example, bit lines BL1_1 to BL4_1 may be formed to extend in a first direction, and word lines WL1_1 to WL3_1 may be formed to extend in a second direction so that the word lines cross the bit lines BL1_1 to BL4_1, and resistance memory cells MC may be formed in regions where the bit lines BL1_1 to BL4_1 and the word lines WL1_1 to WL3_1 cross each other.

Further, as illustrated in FIG. 4, the memory cell array may have a three-dimensional (3D) laminated structure. The 3D laminated structure means a structure in which a plurality of memory cell layers 111_1 to 111_8 are vertically laminated. In the drawing, it is exemplified that 8 memory cell layers 111_1 to 111_8 are laminated, but the present inventive concept is not limited thereto. Here, the respective memory cell layers 111_1 to 111_8 may include a plurality of memory cell groups and/or a plurality of redundancy memory cell groups. In the case where the memory cell array has a 3D laminated structure, in some embodiments the respective memory cell layers 111_1 to 111_8 may have the cross point structure as illustrated in FIG. 3, but the present inventive concept is not limited thereto.

Figure 5:
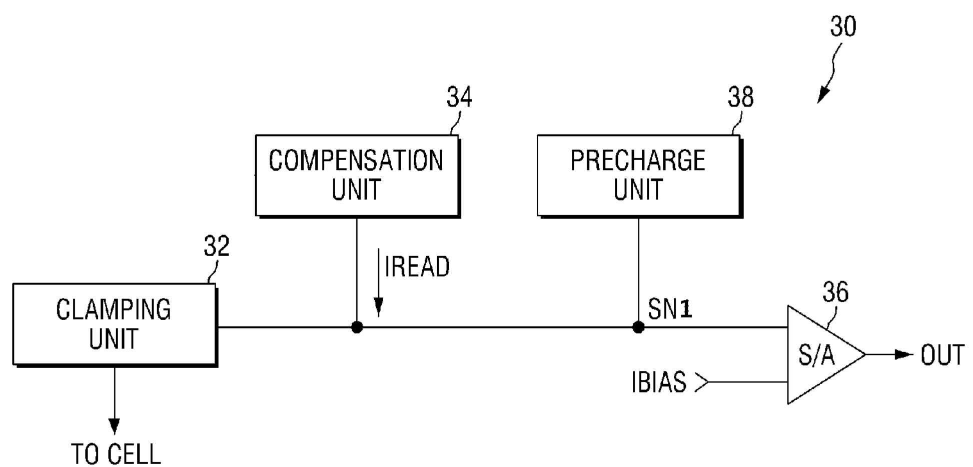
FIG. 5 illustrates an exemplary embodiment of a read circuit of FIG. 1.

FIG. 5 illustrates an exemplary embodiment of a read circuit of FIG. 1.

Referring to FIG. 5, read circuit 30 may include a sensing node SN1, a precharge unit 38, a compensation unit (or read bias providing unit) 34, a clamping unit 32, and a sense amplifier 36.

Precharge unit 38 precharges sensing node SN1 to a specific voltage level. Specifically, sensing node SN1 is precharged to the specific voltage level before compensation unit 34 provides a read bias IREAD to sensing node SN1.

Compensation unit 34 provides the read bias IREAD to sensing node SN1 to compensate for a decrease in the level of the sensing node SN1 that occurs due to a cell current Icell that penetratingly flows through the selected nonvolatile memory cell.

Clamping unit 32 is connected between the nonvolatile memory cell selected and the sensing node SN1 to clamp the level of the bit line within an appropriate readable range. Specifically, clamping unit 32 clamps the bit line level to a predetermined level that is equal to or less than a threshold voltage Vth of the phase change material. This is because if the bit line level becomes higher than the threshold voltage Vth, the phase of the phase change material of the selected nonvolatile memory cell may be changed.

Sense amplifier 36 is connected to sensing node SN1 to sense the level change of sensing node SN1. Specifically, sense amplifier 36 compares the level of sensing node SN1 with a reference bias IBIAS and outputs the result of the comparison. Sense amplifier 36 may be a current sense amplifier or a voltage sense amplifier, and a current sense amplifier is exemplarily illustrated in FIG. 5.

The level of the reference bias IBIAS may be trimmed according to the result of a test. That is, the level of the reference bias IBIAS may be adjusted in relation to the trimming signal REFC that is provided from trimming circuit 100. For example, the trimming signal REFC may be applied to sense amplifier 36 as the reference bias IBIAS, or the reference bias IBIAS may be changed according to the trimming signal REFC.

Further, the level of the read bias IREAD may be adjusted in response to the trimming signal REFC that is provided from trimming circuit 100. For example, the trimming signal REFC may be applied to sensing node SN1 as the reference bias IBIAS, or compensation unit 34 may change the level of the read bias TREAD according to the trimming signal REFC.

Figure 6:
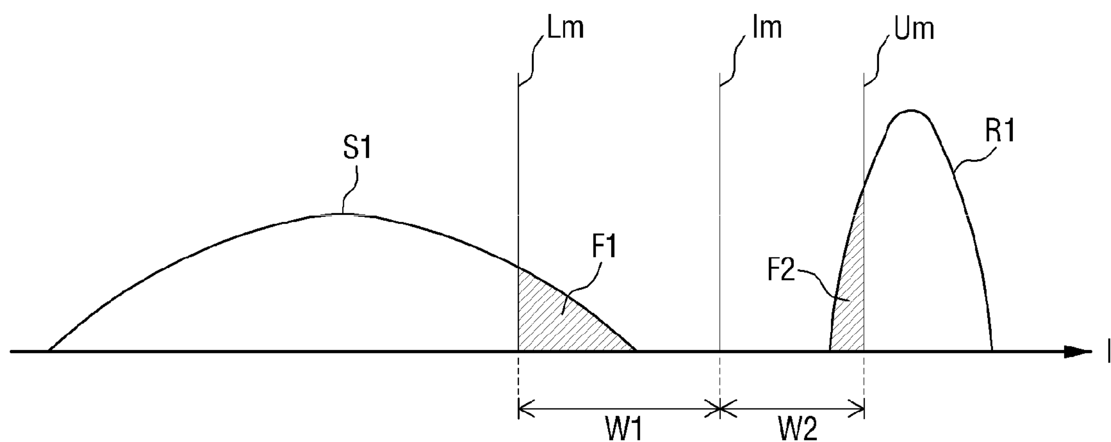
FIGS. 6 to 8 are diagrams for explaining a method for testing a nonvolatile memory device according to an embodiment of the present inventive concept.
Figure 7:
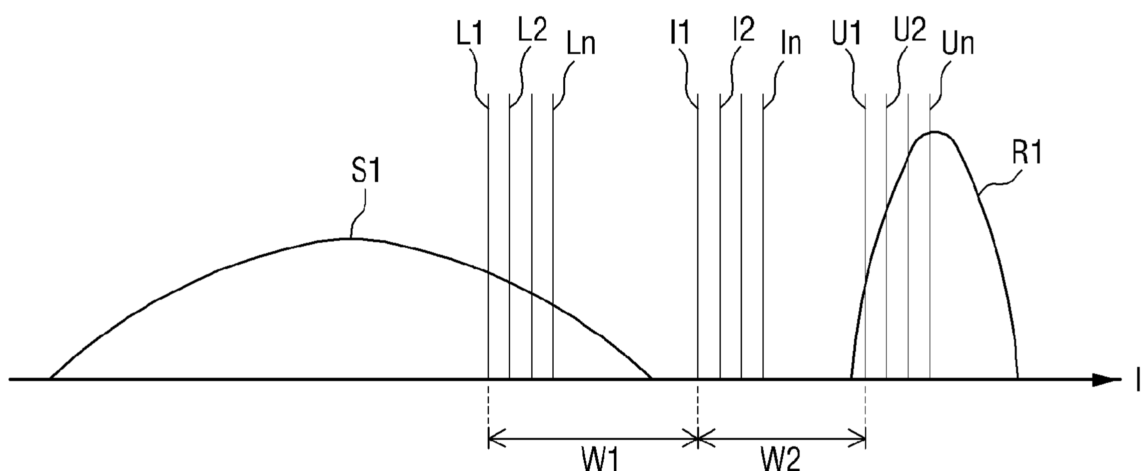
Figure 8:
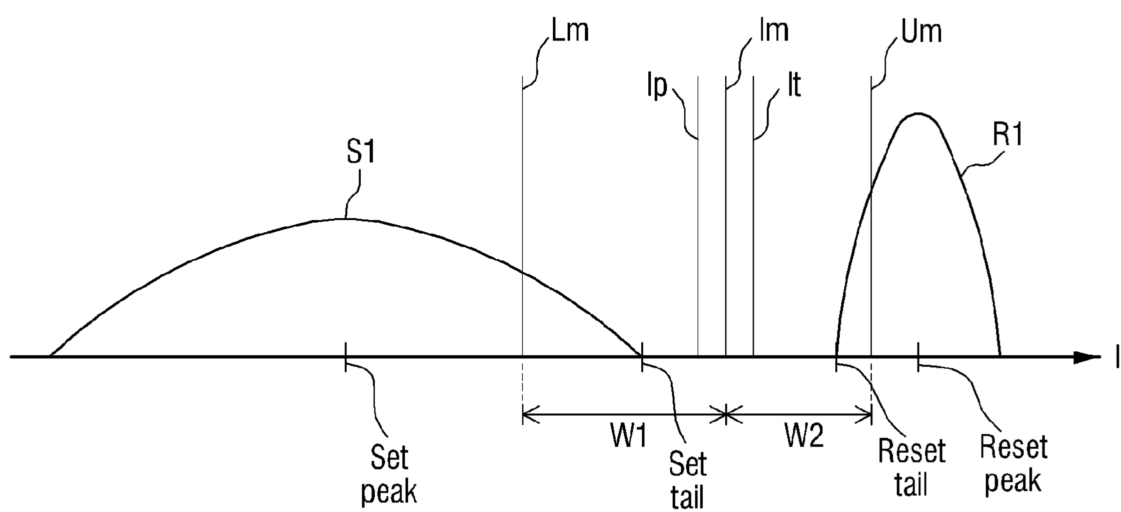

FIGS. 6 to 8 are diagrams for explaining a method for testing a nonvolatile memory device according to an embodiment of the present inventive concept. In FIGS. 6 to 8, the x-axis represents current, and the y-axis represents the number of bits.

First, referring to FIG. 6, a first resistance dispersion S1 and a second resistance dispersion R1 of the nonvolatile memory device are monitored.

Specifically, the first resistance dispersion S1 and the second resistance dispersion R1 may be a set dispersion and a reset dispersion, respectively. FIG. 6 illustrates the set dispersion S1 as a dispersion of current "I" (horizontal axis) for bits which are set with a relatively low resistance (e.g., store a logic "1") in the nonvolatile memory device, and the reset dispersion R1 represents the dispersion of current "I" for bits which are reset with a relatively high resistance (e.g., store a logic "0") in the nonvolatile memory device. Here it is understood that the dispersion of current "I" illustrated in FIG. 6 for the set bits and reset bits actually represents a dispersion in the resistance values of the set bits and reset bits in the nonvolatile memory device, and therefore the dispersions are referred to as a first resistance dispersion S1 and a second resistance dispersion R1. Further, if the nonvolatile memory device is a Single Level Cell (SLC) device, two resistance dispersions may be present, while if the nonvolatile memory device is a Multi Level Cell (MLC) device, three or more resistance dispersions may be present. Hereinafter, for convenience in explanation, it is assumed in the following description that two resistance dispersions are present.

The first resistance dispersion S1 and the second resistance dispersion R1 may be different than each other, and in particular may be asymmetric with respect to each other. That is, the width of the first resistance dispersion S1 may be wider than the width of the second resistance dispersion R1. Further, the peak value of the first resistance dispersion S1 may be less than the peak value of the second resistance dispersion R1.

In a method for testing a nonvolatile memory device according to an embodiment of the present inventive concept, a plurality of memory chips (i.e., nonvolatile memory devices) may be arranged on one wafer. The resistance dispersion may be monitored for each memory chip.

Then, a lower test bias level Lm and an upper test bias level Um, which are positioned on opposite sides about a reference bias level Im, are determined.

Here, the lower test bias level Lm and the upper test bias level Um are values displaced by lower and upper margins W1 and W2, respectively, from the reference bias level Im. Specifically, in the case of driving the nonvolatile memory device, an actual user discerns the data (e.g., as being a "1" or "0") using the reference bias IBIAS having the reference bias level Im. However, in a test stage, in consideration of more stringent conditions, a test is performed using the lower test bias level Lm and the upper test bias level Um taking into account the margins W1 and W2 displaced from the reference bias level Im.

The lower margin W1 and the upper margin W2 may be values that are predetermined through various kinds of tests. In general, the lower margin W1 and the upper margin W2 may be the same as each other or different from each other. W1 may be different than W2 because, as described above, the first resistance dispersion S1 and the second resistance dispersion R1 may be asymmetric with respect to each other, and the respective memory chips may show different characteristics. For example, the size of the lower margin W1 may be 3 μA, and the size of the upper margin W2 may be 2 μA.

Then, the number of first fail bits that are generated in the first resistance dispersion S1 based on the upper test bias level Lm, and the number of second fail bits that are generated in the second resistance dispersion R1 based on the lower test bias level Um, are determined (e.g., calculated).

Specifically, a bit included in a first region F1 of the first resistance dispersion S1 has a current which is greater than the lower test bias level Lm, and thus is called a fail bit (hereinafter referred to as a "first fail bit"). A bit included in a second region F2 of the second resistance dispersion R1 has a current which is less than the upper test bias level Um, and thus corresponds to a fail bit (hereinafter referred to as a "second fail bit").

Then, the level of the reference bias IBIAS is adjusted or trimmed to a selected reference bias level using the number of first fail bits and the number of second fail bits. For example, the level of the reference bias IBIAS may be trimmed so that the sum of the number of first fail bits and the number of second fail bits is minimized.

Here, referring to FIG. 7 and Table 1 below, the process as described above using FIG. 6 will be described in more detail.

As shown in FIG. 7 and Table 1, first to n-th candidate reference bias levels I1 to In (where, n is a natural number) become candidates for the selected reference bias level to which the level of reference bias IBIAS may be trimmed.

Then, first to n-th upper test bias levels U1 to Un, and first to n-th lower test bias levels L1 to Ln corresponding to the first to n-th candidate reference bias levels I1 to In are determined. For example, the k-th upper test bias level Uk (where, k is a natural number that is equal to or greater than 1 and equal to or less than n) and the k-th lower test bias level Lk are positioned on opposite sides of the k-th candidate reference bias level Ik.

Here, the k-th upper test bias level Uk is spaced apart from the k-th candidate reference bias level Ik by the k-th upper margin, and the k-th lower test bias level Lk is spaced apart from the k-th candidate reference bias level Ik by the k-th lower margin. As described above, the k-th upper margin and the k-th lower margin may be the same as each other or different from each other. FIG. 7 exemplarily illustrates a case where the first upper margin W2 and the first lower margin W1 are different from each other.

Here, the g-th upper margin (where g is a natural number that is equal to or greater than 1 and equal to or less than n) and the (g+1)-th upper margin may be equal to each other. That is, the difference between the g-th upper test bias level Ug and the corresponding candidate reference bias level Ig may be equal to the difference between the (g+1)-th upper test bias level Ug+1 and the corresponding candidate reference bias level Ig+1. Further, the g-th lower margin and the (g+1)-th lower margin may be equal to each other. That is, the difference between the g-th lower test bias level Lg and the corresponding candidate reference bias level Ig may be equal to the difference between the (g+1)-th lower test bias level Lg+1 and the corresponding candidate reference bias level Ig+1.

Here, the gap between the g-th lower test bias level Lg and the g-th upper test bias level Ug may be equal to the gap between the (g+1)-th lower test bias level Lg+1 and the (g+1)-th upper test bias level Ug+1.

Then, the number of first to n-th upper fail bits UFB1 to UFBn and the number of first to n-th lower fail bits LFB1 to LFBn are determined (e.g., calculated) using the first to n-th upper test bias levels U1 to Un and the first to n-th lower test bias levels L1 to Ln, respectively.

The number of k-th lower fail bits is generated from the first resistance dispersion based on the k-th lower test bias level, and the number of k-th upper fail bits is generated from the second resistance dispersion based on the k-th upper test bias level (refer to regions F1 and F2 of FIG. 6).

Then, first to n-th sums Sum1 to Sumn are determined (e.g., calculated) using the number of first to n-th lower fail bits LFB1 to LFBn and the number of first to n-th upper fail bits UFB1 to UFBn. Here, the k-th sum Sumk is determined (e.g., calculated) using the number of k-th lower fail bits LFBk and the number of k-th upper fail bits UFBk.

Here, in some embodiments the k-th sum Sumk may be a simple sum of the number of k-th lower fail bits LFBk and the number of k-th upper fail bits UFBk, but other arrangements are possible. For example, the k-th sum may be a weighted value sum obtained by applying corresponding weight values to the number of k-th lower fail bits LFBk and the number of k-th upper fail bits UFBk, respectively.

A selected reference bias level for trimming the level of the reference bias IBIAS is determined using the first to n-th sums Sum1 to Sumn. For example, if the m-th sum Summ is the smallest among the first to n-th sums Sum1 to Sumn, the reference bias level Im that corresponds to the m-th sum Summ may be determined as the selected reference bias level for reference bias IBIAS.

TABLE 1

| Reference Bias Level | Upper Test Bias Level | Lower Test Bias Level | Upper Fail Bits | Lower Fail Bits | Sum of Fail Bits |
|---|---|---|---|---|---|
| I1 | U1 | L1 | UFB1 | LFB1 | Sum1 |
| I2 | U2 | L2 | UFB2 | LFB2 | Sum2 |
| . . . | . . . | . . . | . . . | . . . | . . . |
| Ik | Uk | Lk | UFBk | LFBk | Sumk |
| . . . | . . . | . . . | . . . | . . . | . . . |
| Im | Um | Lm | UFBm | LFBm | Summ |
| . . . | . . . | . . . | . . . | . . . | . . . |
| In | Un | Ln | UFBn | LFBn | Sumn |

Here, referring to FIG. 8, a first reference bias level It corresponds to an average bias of a set tail of the first resistance dispersion S1 and a reset tail of the second resistance dispersion R1.

In contrast, a second reference bias level Ip corresponds to an average bias of a set peak of the first resistance dispersion S1 and a reset peak of the second resistance dispersion R1.

The finally determined selected reference bias level Im may be different from the first reference bias level It and the second reference bias level Ip. In FIG. 8, since a current I of 0 μA is positioned to the rightward direction of the second resistance dispersion R1, the absolute value of the bias becomes larger proceeding in the leftward direction of the graph. Accordingly, an absolute value of the selected reference bias level Im may be greater than an absolute value of the first reference bias level It and may be less than an absolute value of the second reference bias level Ip.

Figure 9:
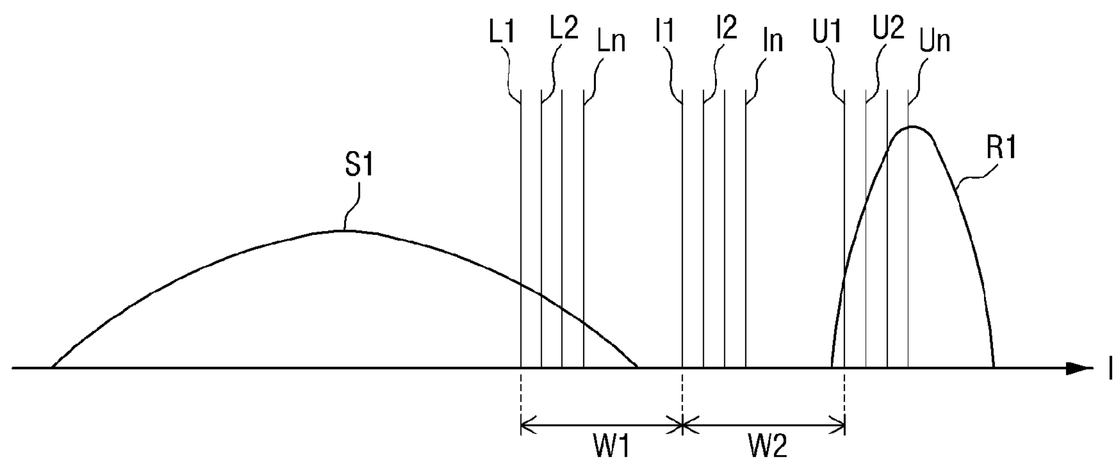
FIG. 9 is a diagram for explaining a method for testing a nonvolatile memory device according to another embodiment of the present inventive concept.

FIG. 9 is a diagram for explaining a method for testing a nonvolatile memory device according to another embodiment of the present inventive concept. For convenience in explanation, explanation will be made around the things which differ from those as described above using FIGS. 6 to 8. In FIG. 9, the x-axis represents current, and the y-axis represents the number of bits.

Referring to FIG. 9, the k-th upper test bias level Uk is spaced apart from the k-th candidate reference bias level Ik by the k-th upper margin, and the k-th lower test bias level Lk is spaced apart from the k-th candidate reference bias level Ik by the k-th lower margin. As described above, the k-th upper margin and the k-th lower margin may be equal to each other. FIG. 9 exemplarily illustrates a case where the first upper margin W2 and the first lower margin W1 are equal to each other.

Figure 10:
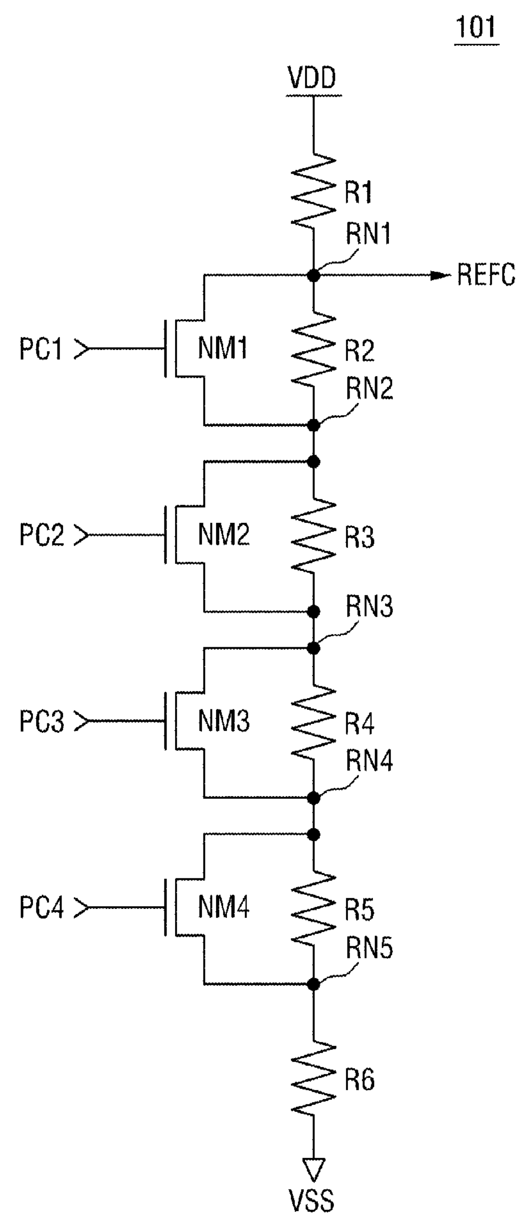
FIG. 10 is an exemplary circuit diagram of a trimming circuit of FIG. 1.
Figure 11:
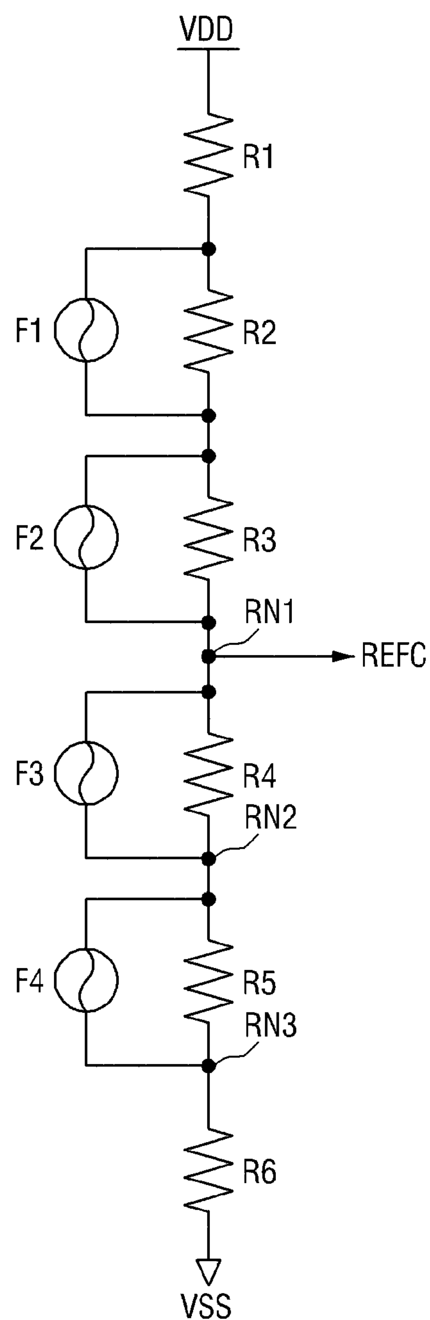
FIG. 11 is another exemplary circuit diagram of a trimming circuit of FIG. 1.

FIG. 10 is an exemplary circuit diagram of a trimming circuit of FIG. 1, and FIG. 11 is another exemplary circuit diagram of a trimming circuit of FIG. 1.

Referring to FIG. 10, a trimming circuit 101 includes a plurality of resistors R1 to R6 connected in series between power supply voltage VDD and ground VSS, and first to fourth N-type transistors NM1 to NM4 that are driven in response to compensation control signals PC1 to PC4 to output a compensation reference voltage to a compensation reference node RN1 as a trimming signal REFC.

If the compensation control signals PC1 to PC4 are applied as "1100", the first and second N-type MOS transistors NM1 and NM2 are turned on, thereby bypassing resistors R2 and R3, and thus the resistors R2 and R3 do not exert an influence on the level determination of the compensation reference voltage. In this case, the level of the compensation reference voltage may be set to an appropriate intermediate value in consideration of a positive shift or a negative shift.

For example, the compensation control signals PC1 to PC4 may be applied as "1000". In this case, the first N-type MOS transistor NM1 is turned on so as to bypass R2, and thus the resistor R2 does not take part in the level determination of the compensation reference voltage. As a result, since the level of the compensation reference voltage is determined by the resistors R1, R3, R4, R5, and R6, the level of the compensation reference voltage is increased in comparison to the case where the resistors R2 and R3 were bypassed.

In contrast, the compensation control signals PC1 to PC4 may be applied as "1101". In this case, the first, second, and fourth N-type MOS transistors NM1, NM2, and NM4 are turned on so as to bypass resistors R2, R3 and R5, and thus the resistors R2, R3, and R5 do not take part in the level determination of the compensation reference voltage. As a result, since the level of the compensation reference voltage is determined by the resistors R1, R4, and R6, the level of the compensation reference voltage is decreased in comparison to the case where only the resistors R2 and R3 were bypassed.

The compensation reference voltage that is generated as the trimming signal REFC may be applied to read circuit 30 of the resistance memory device for read operation compensation. Accordingly, in some embodiments, the compensation reference voltage (and therefore the trimming signal REFC) may be changed dynamically by changing the levels of the compensation control signals PC1 to PC4.

FIG. 11 illustrates an example of a trimming circuit having fuses that can be blown by laser beams or current if it is necessary to permanently set the level of the trimming signal REFC before shipment of the product.

Referring to FIG. 11, a trimming circuit 101 includes a plurality of resistors R1 to R6 connected in series between power supply voltage VDD and ground VSS, and first to fourth fuses F1 to F4 that are selectively cut or blown open to output a compensation reference voltage to a compensation reference node RN1 as a trimming signal REFC.

In a state where the first to fourth fuses F1 to F4 are not cut, the level of the compensation reference voltage is set to an appropriate intermediate value in consideration of a positive shift or a negative shift.

For example, when at least one of the third and fourth fuses F3 and F4 is cut, at least one of the resistors R4 and R5 may take part in the level determination of the compensation reference voltage together with the resistor R6. As a result, since the synthetic resistance value of the resistors that are positioned on a lower portion of an output node RN1 is increased, the level of the compensation reference voltage is increased.

In contrast, when at least one of the first and second fuses F1 and F2 is cut, at least one of the resistors R2 and R3 may take part in the level determination of the compensation reference voltage together with the resistor R1. As a result, since the synthetic resistance value of the resistors that are positioned on an upper portion of the output node RN1 is increased, the level of the compensation reference voltage is decreased.

In the same manner, the compensation reference voltage that is generated as the trimming signal REFC may be applied to read circuit 30 of FIG. 1 for read operation compensation.

That is, trimming circuit 101 and trimming circuit 102 each comprise a series chain of resistances connected in series between VDD and VSS, and one or more selectively-activated bypass devices each connected across one of the resistances, with a compensation reference voltage being tapped off in between two of the series resistances to provide a programmable compensation reference voltage for the trimming signal REFC. It should be understood that other arrangements for generating a programmable compensation reference voltage for the trimming signal REFC are contemplated.

Figure 17:
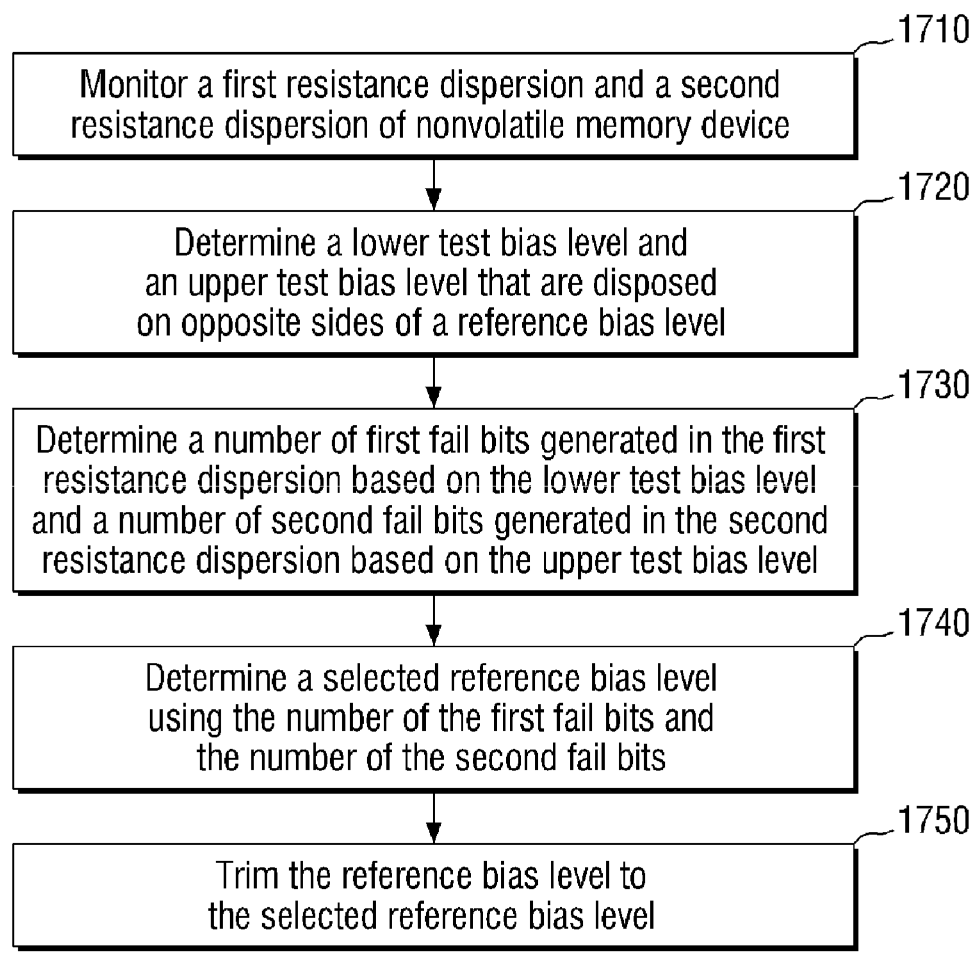
FIG. 17 shows a flowchart illustrating a method for testing a nonvolatile memory device according to one or more embodiments.

FIG. 17 shows a flowchart 1700 illustrating a method for testing a nonvolatile memory device according to one or more embodiments.

An operation 1710 includes monitoring a first resistance dispersion and a second resistance dispersion of the nonvolatile memory device.

An operation 1720 includes determining a lower test bias level and an upper test bias level that are disposed on opposite sides of a reference bias level.

An operation 1730 includes determining a number of first fail bits generated in the first resistance dispersion based on the lower test bias level and a number of second fail bits generated in the second resistance dispersion based on the upper test bias level;

An operation 1740 includes determining a selected reference bias level using the number of the first fail bits and the number of the second fail bits.

An operation 1750 includes trimming the reference bias level to the selected reference bias level.

Figure 18:
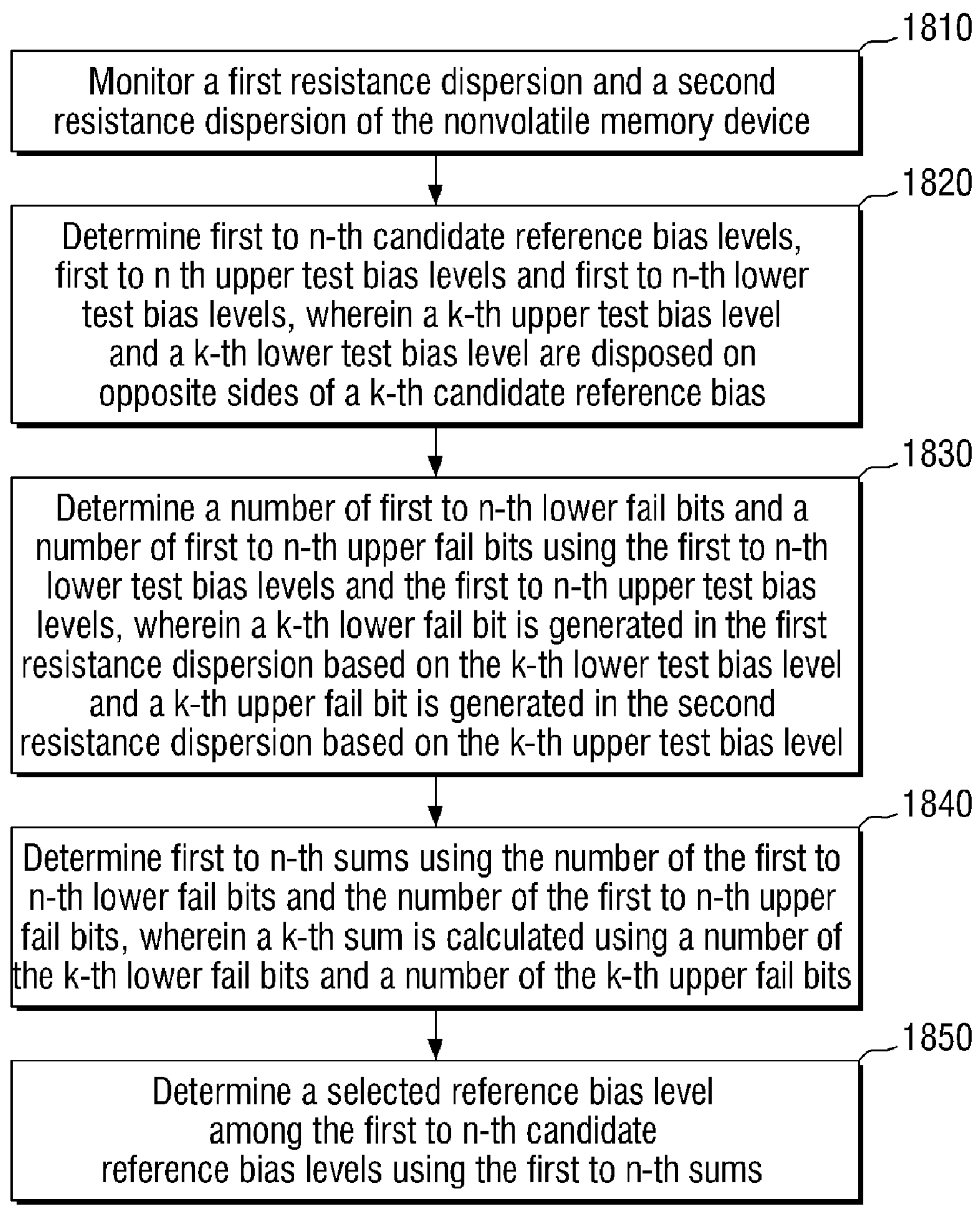
FIG. 18 shows another flowchart a method for testing a nonvolatile memory device according to one or more embodiments.

FIG. 18 shows another flowchart 1800 illustrating a method for testing a nonvolatile memory device according to one or more embodiments.

An operation 1810 includes monitoring a first resistance dispersion and a second resistance dispersion of the nonvolatile memory device.

An operation 1820 includes determining first to n-th candidate reference bias levels, first to n-th upper test bias levels, and first to n-th lower test bias levels, wherein a k-th upper test bias level and a k-th lower test bias level are disposed on opposite sides of a k-th candidate reference bias, where n is a natural number, and k is equal to or greater than 1 and equal to or less than n.

An operation 1830 includes determining/ascertaining (e.g., calculating) a number of first to n-th lower fail bits and a number of first to n-th upper fail bits using the first to n-th lower test bias levels and the first to n-th upper test bias levels, wherein a k-th lower fail bit is generated in the first resistance dispersion based on the k-th lower test bias level, and a k-th upper fail bit is generated in the second resistance dispersion based on the k-th upper test bias level.

An operation 1840 includes determining/ascertaining (e.g., calculating) first to n-th sums using the number of the first to n-th lower fail bits and the number of the first to n-th upper fail bits, wherein a k-th sum is calculated using a number of the k-th lower fail bits and a number of the k-th upper fail bits.

An operation 1850 includes determining a selected reference bias level among the first to n-th candidate reference bias levels, using the first to n-th sums.

FIGS. 12 to 16 are diagrams explaining a memory system according to some embodiments of the present inventive concept. Here, FIGS. 12 to 16 relate to a memory system that uses a nonvolatile memory device according to some embodiments of the present inventive concept.

Figure 12:
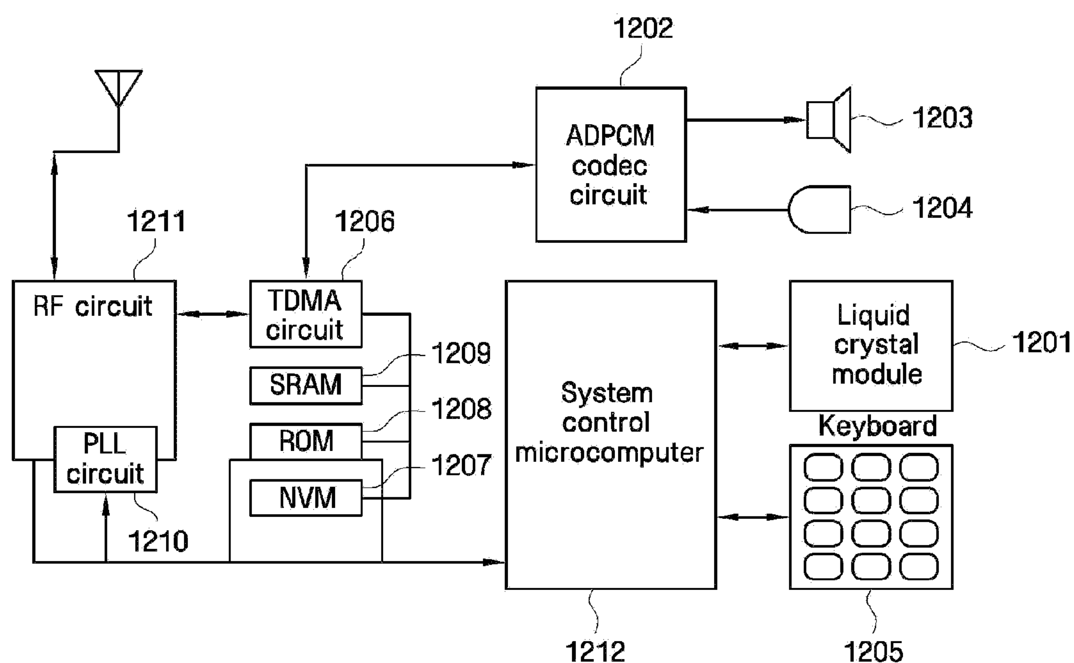
FIG. 12 is an exemplary diagram of a cellular phone system using a nonvolatile memory device according to some embodiments of the present inventive concept.

FIG. 12 is an exemplary diagram of a cellular phone system using a nonvolatile memory device according to some embodiments of the present inventive concept.

Referring to FIG. 12, the cellular phone system may include user interface devices, for example liquid crystal device 1201, a speaker 1203, a microphone 1204 and optionally a keyboard 1205. The cellular phone system may also include a compression or decompression Adaptive Differential Pulse-Code Modulation (ADPCM) codec circuit 1202, a Time Domain Multiple Access (TDMA) circuit 1206 for time-division-multiplexing digital data, a Phase lock Loop (PLL) circuit 1210 setting a carrier frequency of a wireless signal, and an RF circuit 1211 for transferring and/or receiving the wireless signal.

Further, the cellular phone system may include various kinds of memory devices, and for example, may include a nonvolatile memory device 1207, a Read Only Memory (ROM) 1208, and a static RAM (SRAM) 1209. Nonvolatile memory device 1207 may be the nonvolatile memory device according to the embodiments of the present inventive concept as described above with respect to FIGS. 1-11, and may store, for example, ID numbers. ROM 1208 may store programs, and SRAM 1209 may serve as a workspace for a system control microcomputer 1212 or may temporarily store data. Here, the system control microcomputer 1212 may be a processor which can control write and read operations of nonvolatile memory device 1207.

Figure 13:
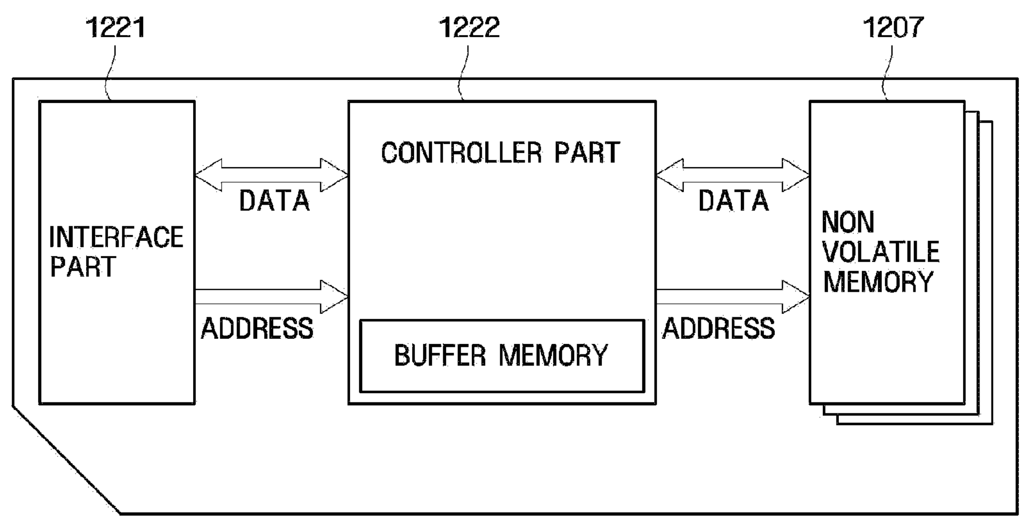
FIG. 13 is an exemplary diagram of a memory card using a nonvolatile memory device according to some embodiments of the present inventive concept.

FIG. 13 is an exemplary diagram of a memory card using a nonvolatile memory device according to some embodiments of the present inventive concept. The memory card may be, for example, a MultiMediaCard (MMC) card, a Secure Digital (SD) card, a multiuse card, a micro SD card, a memory stick, a compact SD card, an ID card, a Personal Computer Memory Card International Association (PCMCIA) card, a Solid State Disk (SSD) card, a chip card, a smart card, or a Universal Serial Bus (USB) card.

Referring to FIG. 13, the memory card may include at least one of an interface part 1221 performing an external interface for the memory card, a controller 1222 having a buffer memory and controlling the operation of the memory card, and a nonvolatile memory device according to the embodiments of the present inventive concept. Controller 1222 is a processor which can control write and read operations of nonvolatile memory device 1207. Specifically, controller 1222 is coupled to nonvolatile memory device 1207 and interface part 1221 through a data bus DATA and an address bus ADDRESS.

Figure 14:
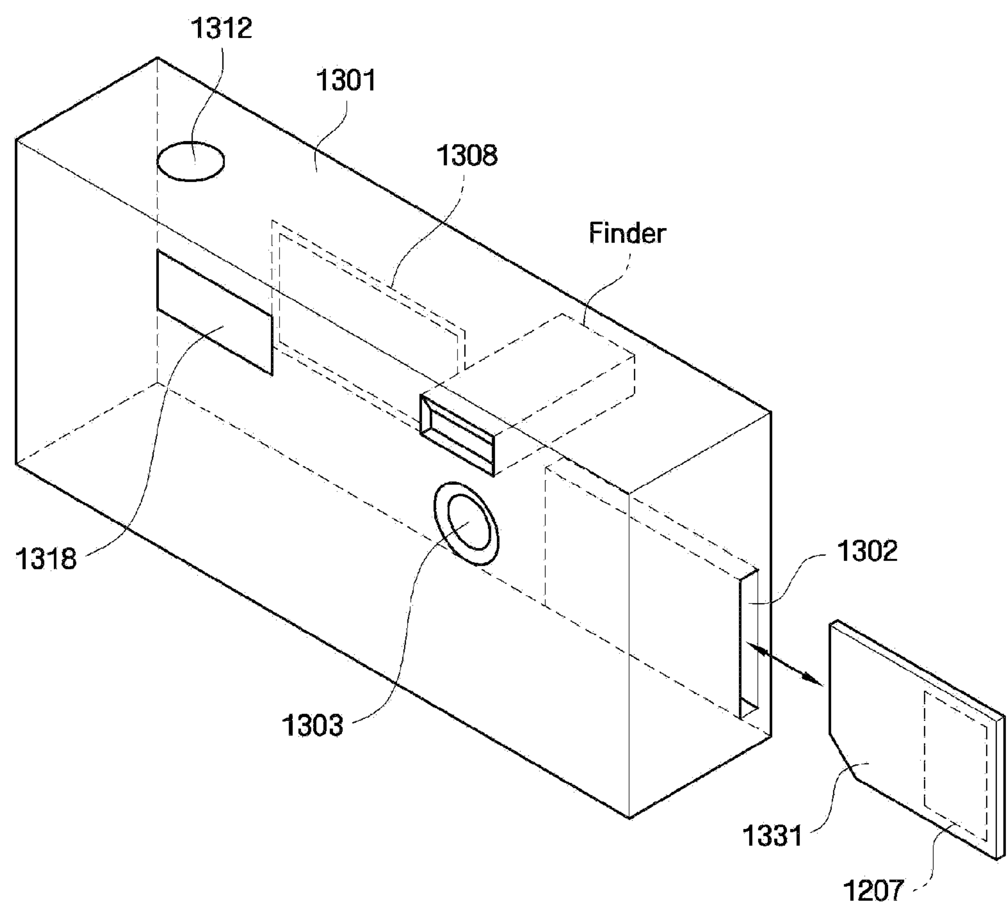
FIG. 14 is an exemplary diagram of a digital still camera using a nonvolatile memory device according to some embodiments of the present inventive concept.

FIG. 14 is an exemplary view of a digital still camera using a nonvolatile memory device according to some embodiments of the present inventive concept.

Referring to FIG. 14, the digital still camera includes a body 1301, a slot 1302, a lens 1303, a display unit 1308, a shutter button 1312, and a strobe 1318. In particular, a memory card 1331 may be inserted into the slot 1302, and memory card 1331 may include at least one nonvolatile memory device 1207 according to embodiments of the present inventive concept.

If memory card 1331 is of a contact type, memory card 1331 comes in electrical contact with a specific electrical circuit on a circuit board when memory card 1331 is inserted into slot 1302. If memory card 1331 is of a non-contact type, memory card 1331 performs communications through a wireless signal.

Figure 15:
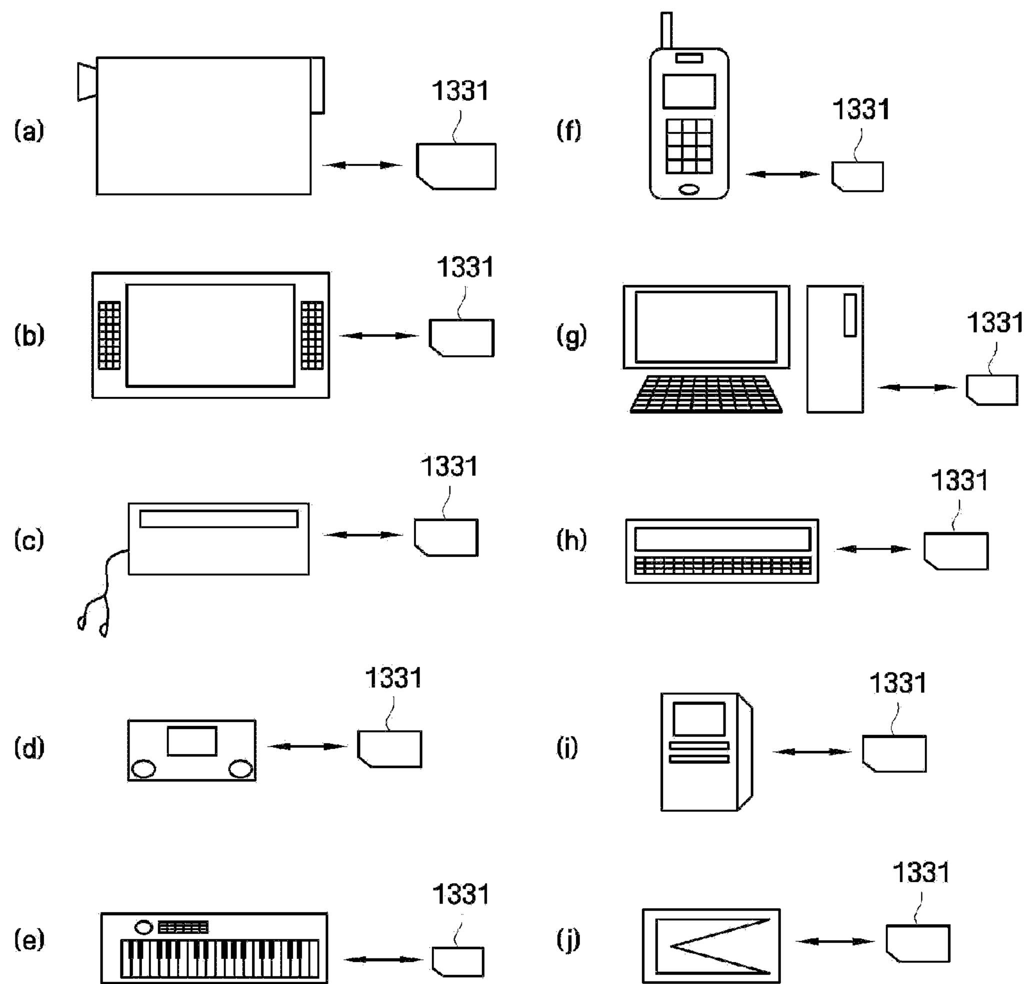
FIG. 15 is an exemplary diagram explaining various systems using a memory card of FIG. 13.

FIG. 15 is an exemplary view explaining various systems using the memory card of FIG. 13.

Referring to FIG. 15, memory card 1331 may be used in (a) a video camera, (b) a television receiver, (c) an audio device, (d) a game machine, (e) an electronic music device, (f) a cellular phone, (g) a computer, (h) a Personal Digital Assistant (PDA), (i) a voice recorder, or (j) a PC card.

Figure 16:
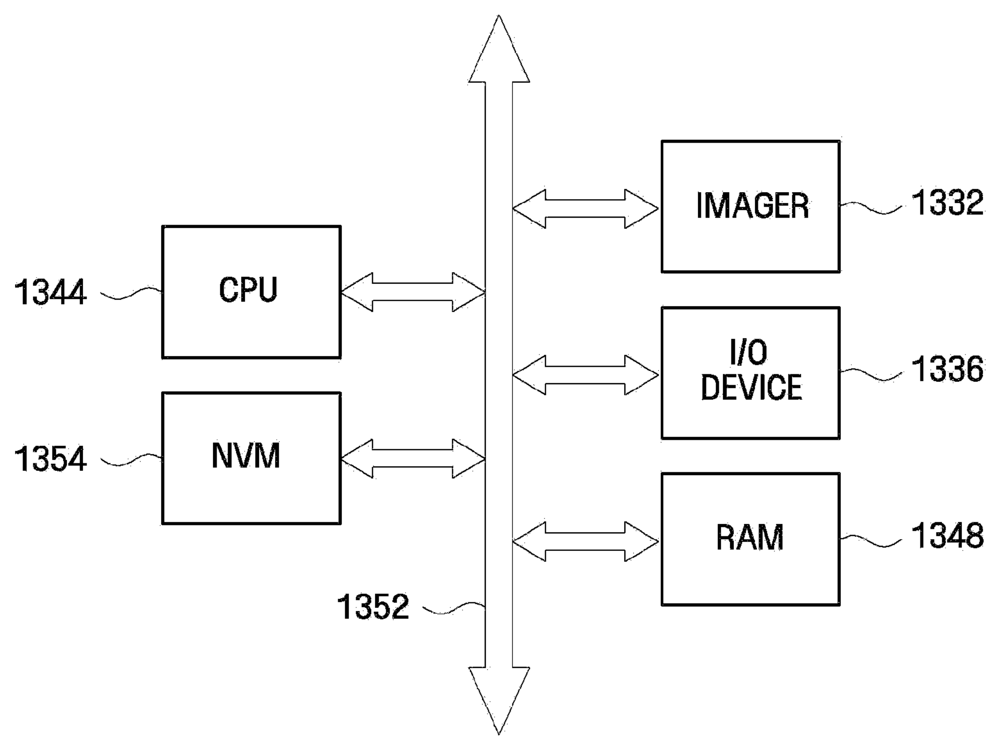
FIG. 16 is an exemplary diagram of an image sensor system using a nonvolatile memory device according to some embodiments of the present inventive concept.

FIG. 16 is an exemplary diagram of an image sensor system using a nonvolatile memory device according to some embodiments of the present inventive concept.

Referring to FIG. 16, an image sensor system may include an image sensor 1332, an input/output device 1336, a RAM 1348, a CPU 1344, and a nonvolatile memory device 1354 according to embodiments of the present inventive concept. The respective constituent elements, that is, the image sensor 1332, the input/output device 1336, the RAM 1348, the CPU 1344, and the nonvolatile memory device 1354 communicate with each other through a bus 1352. The image sensor 1332 may include a photo sensing element, such as a photo gate and a photodiode. The respective constituent elements may be constructed into one chip together with a processor, or may be constructed as a separate chip from the processor.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A method for testing a nonvolatile memory device, the method comprising:

monitoring a first resistance dispersion and a second resistance dispersion of a nonvolatile memory device;

determining a lower test bias level and an upper test bias level that are disposed on opposite sides of a reference bias level;

determining a number of first fail bits generated in the first resistance dispersion based on the lower test bias level and a number of second fail bits generated in the second resistance dispersion based on the upper test bias level;

determining a selected reference bias level using the number of the first fail bits and the number of the second fail bits; and trimming the reference bias level to the selected reference bias level, wherein the lower test bias level is spaced apart by a first margin from the reference bias level, the upper test bias level is spaced apart by a second margin from the reference bias level, and the first margin and the second margin are different from each other.

2. The method for testing a nonvolatile memory device of claim 1, wherein said trimming the reference bias level comprises trimming the reference bias level so that a sum of the number of the first fail bits and the number of the second fail bits is minimized.

3. The method for testing a nonvolatile memory device of claim 1, wherein the first resistance dispersion and the second resistance dispersion are asymmetric with respect to each other.

4. The method for testing a nonvolatile memory device of claim 1, wherein the first resistance dispersion and the second resistance dispersion correspond to set data and reset data, respectively, and the reference bias level is a level of a reference bias of a sense amplifier for reading the set data and the reset data.

5. The method for testing a nonvolatile memory device of claim 1, wherein an absolute value of the selected reference bias level is larger than an absolute value of an average of a tail of the first resistance dispersion and a tail of the second resistance dispersion.

6. The method for testing a nonvolatile memory device of claim 1, wherein an absolute value of the selected reference bias level is less than an absolute value of an average of a peak of the first resistance dispersion and a peak of the second resistance dispersion.

7. A method for testing a nonvolatile memory device, comprising:

monitoring a first resistance dispersion and a second resistance dispersion of the nonvolatile memory device;

determining first to n-th candidate reference bias levels, first to n-th upper test bias levels, and first to n-th lower test bias levels, wherein a k-th upper test bias level and a k-th lower test bias level are disposed on opposite sides of a k-th candidate reference bias level, where n is a natural number, and k is equal to or greater than 1 and equal to or less than n;

determining a number of first to n-th lower fail bits and a number of first to n-th upper fail bits using the first to n-th lower test bias levels and the first to n-th upper test bias levels, wherein a k-th lower fail bit is generated in the first resistance dispersion based on the k-th lower test bias level, and a k-th upper fail bit is generated in the second resistance dispersion based on the k-th upper test bias level;

determining first to n-th sums using the number of the first to n-th lower fail bits and the number of the first to n-th upper fail bits, wherein a k-th sum is calculated using a number of the k-th lower fail bits and a number of the k-th upper fail bits; and determining a selected reference bias level among the first to n-th candidate reference bias levels, using the first to n-th sums, wherein an absolute value of the selected reference bias level is less than an absolute value of an average of a peak of the first resistance dispersion and a peak of the second resistance dispersion.

8. The method for testing a nonvolatile memory device of claim 7, wherein an m-th sum (where, m is a natural number that is equal to or greater than 1 and equal to or less than n) is a smallest sum among the first to n-th sums, and the selected reference bias level is an m-th candidate reference bias level that corresponds to the m-th sum.

9. The method for testing a nonvolatile memory device of claim 7, wherein the k-th upper test bias level is spaced apart by a k-th upper margin from the k-th candidate reference bias level, the k-th lower test bias level is spaced apart by a k-th lower margin from the k-th candidate reference bias level, and the k-th upper margin and the k-th lower margin are different from each other.

10. The method for testing a nonvolatile memory device of claim 7, wherein a g-th upper test bias level is spaced apart by a g-th upper margin from a g-th candidate reference bias level from among the first to n-th candidate reference bias levels, and a g-th lower test bias level is spaced apart by a g-th lower margin from the g-th candidate reference bias level, and wherein the g-th upper margin and a (g+1)-th upper margin are equal to each other, the g-th lower margin and a (g+1)-th lower margin are equal to each other, and g is a natural number that is equal to or greater than 1 and equal to or less than n.

11. The method for testing a nonvolatile memory device of claim 7, wherein a g-th upper test bias level is spaced apart by a g-th upper margin from a g-th candidate reference bias level from among the first to n-th candidate reference bias levels, and a g-th lower test bias level is spaced apart by a g-th lower margin from the g-th candidate reference bias level, and wherein a gap between the g-th lower test bias level and the g-th upper test bias level is equal to a gap between a (g+1)-th lower test bias level and a (g+1)-th upper test bias level, and g is a natural number that is equal to or greater than 1 and equal to or less than n.

12. The method for testing a nonvolatile memory device of claim 7, wherein the first resistance dispersion and the second resistance dispersion are asymmetric with respect to each other.

13. The method for testing a nonvolatile memory device of claim 7, wherein the absolute value of the selected reference bias level is greater than an absolute value of an average of a tail of the first resistance dispersion and a tail of the second resistance dispersion.

14. A nonvolatile memory device, comprising:

a plurality of nonvolatile memory cells each configured to be selectively set and reset to store data therein;

a read circuit configured to read the stored data from the memory cells; and a trimming circuit configured to supply a trimming signal to the read circuit to match a trimmed reference bias level of a reference bias which is employed by the read circuit to read the stored data from the memory cells, wherein the trimmed reference bias level minimizes a weighted sum of a number of first fail bits and a number of second fail bits, wherein the first fail bits are generated in a first resistance dispersion based on a lower test bias level disposed on a first side of the trimmed reference bias level, wherein the second fail bits are generated in a second resistance dispersion based on an upper test bias level disposed on a second side of the trimmed reference bias level which is opposite the first side, and wherein in the weighted sum the number of first fail bits is weighted by a first weight and the number of second fail bits is weighted by a second weight.

15. The nonvolatile memory device of claim 14, wherein the second weight is different than the first weight.

16. The nonvolatile memory device of claim 14, wherein the second weight is the same as the first weight.

17. The nonvolatile memory device of claim 14, wherein the trimming circuit comprises:

a plurality of resistances connected in series between a first voltage and a second voltage; and a plurality of selectively-activated bypass devices each disposed across a corresponding one of the resistances, wherein the trimming signal is generated from a voltage at a node between two of the resistances.

18. The nonvolatile memory device of claim 17, wherein the selectively-activated bypass devices each comprise one of a transistor and a fuse.

* * * * *